United States Patent [19]

Bugg

[11] Patent Number: 4,953,022

[45] Date of Patent: Aug. 28, 1990

[54] TELETEXT DECODERS

[75] Inventor: Richard E. F. Bugg, Coulsdon, England

[73] Assignee: U.S. Philips Corporation, New York, N.Y.

[21] Appl. No.: 356,026

[22] Filed: May 23, 1989

[30] Foreign Application Priority Data

May 27, 1988 [GB] United Kingdom ............... 8812592
May 5, 1989 [GB] United Kingdom ............... 8910336

[51] Int. Cl.⁵ ..................... H04N 5/087; H04N 5/04
[52] U.S. Cl. .................................. 358/147; 358/142; 358/146
[58] Field of Search ..................... 358/142, 146, 147

[56] References Cited

U.S. PATENT DOCUMENTS 4,719,510 1/1988 Kinghorn ........................... 358/147

OTHER PUBLICATIONS

"Computer Controlled Teletext: User's Manual"; Kinghorn; Mullard Application Laboratory; Nov. 1, 1983.

Primary Examiner—John W. Shepperd
Assistant Examiner—Michael D. Parker
Attorney, Agent, or Firm—Anne E. Barschall

[57] ABSTRACT

A teletext decoder for teletext information comprising a plurality of different pages each of which is identified by a respective page number and each of which comprises a plurality of data packets each having a respective address. The teletext decoder includes a page memory and a pseudo page clearing arrangement in which a reference flag number (F) is allocated to a page header of a selected page. A packet related flag number (F) is allocated to each packet of the selected page as it is received. Utilisation of any data packet stored in the page memory, whose packet related flag number is not the same as the reference flag number is inhibited and the reference flag number for each successively selected page is changed.

13 Claims, 5 Drawing Sheets

TELETEXT DECODERS

BACKGROUND OF THE INVENTION

This invention relates principally to a teletext decoder for teletext information comprising a plurality of different pages each of which is identified by a respective page number and each of which comprises a plurality of data packets each having a respective address; said teletext decoder including means for selecting a page by its page number, means for detecting a selected page number when received, and at least one page memory for storing received data packets of a selected page in a respective memory portion which is identified by the data packet address, the page memory being a write/read random access memory which data packets can be written into at the respective memory portions to over-write and thereby replace any data packets currently stored therein. The invention also relates to a method of processing teletext information.

The document "Broadcast Teletext Specification", September 1976, published jointly by British Broadcasting Corporation, Independent Broadcasting Authority and British Radio Equipment Manufacturers' Association, discloses a specification for transmitting teletext information in 625-line television systems.

Methods for enhancing the teletext specification given in the said "Broadcast Teletext Specification" are given in the document "World System Teletext and Data Broadcasting System-Technical Specification" December 1987, compiled by the Department of Trade and Industry of the U.K. Government.

The teletext information is usually transmitted as part of the television signal in television lines where no normal television picture information is present. Initially, teletext transmissions in the United Kingdom used as teletext data lines television lines 17 and 18 in first fields and television lines 330 and 331 in second fields, these lines being in the field or vertical blanking intervals (VBI), but current teletext transmissions in the United Kingdom now use at least six television lines in each VBI as data-lines. The VBI transmission is thus, in effect, multiplexed with the normal picture transmission and the teletext information transmitted in this way and representing data for display such as text and graphics can be displayed at a teletext television receiver as a selectable alternative to the normal picture information.

In the above-identified document "Broadcast Teletext Specification", a quantity of teletext information to be considered as an entity is termed a page and all of the pages which are available are normally transmitted in a recurrent cycle, with or without up-dating page information, as appropriate. At a teletext decoder any page can be selected, and the digitally coded data representing the page information is then acquired by the teletext decoder from the cyclic transmission and is stored in a page memory of the teletext decoder for as long as the page is required. A teletext decoder may have a multi-page memory having a plurality of memory portions in which individual pages can be stored.

A page memory of a teletext decoder is usually a write/read random access memory, and when new data is written into a storage location of the page memory it over-writes and thereby replaces any data previously stored in that location. As a consequence, if the data packets of an 'old' page stored in the page memory are not erased before those of a 'new' page are stored therein, the resulting total data in the page memory would include any data packets of the 'old' page that have not been over-written by corresponding data packets of the 'new' page. In other words, one or more spurious data packets may occur in every stored 'new' page.

The said "Broadcast Teletext Specification" provides a page erasure interval by specifying, in effect, that data packets of a page will be transmitted such as to allow an active television field period between the transmission of a page-header of a page and the transmission of subsequent data packets for the page. This interval, which is approximately 20 ms. in 625-line television systems, is a page clearing interval which allows time for a teletext decoder to respond to receipt of the page-header of a new page selected by a viewer to erase from its page memory the data packets of any previously acquired page that is already stored therein, before the data packets of the new page are received. The page memory is thus made ready to store the data packets of the new page as transmitted in the data-lines of vertical blanking intervals subsequent to the vertical blanking interval in which the page-header was transmitted. This provision simplifies teletext decoder design by allowing the page clearing operation to be relatively slow.

With the majority of teletext decoders sold so far the method of clearing the data stored in a page memory was to use the page clearing interval to over-write any stored data by writing the character code for a 'blank space' into every byte location of the page memory. However, this method imposes problems where a teletext decoder has several page memories which all have to be cleared in the page clearing interval, and/or where the page clearing interval is no longer available, as in the case of "full channel" operation in which television lines outside the vertical blanking interval are used for transmitting teletext information.

It is known from U.K. patent application GB No. 2,181,928A (PHB33219) to effect 'pseudo' clearing of a page memory before the reception of a new page, by generating a "found" flag for each received data packet of a newly selected page and using these flags to control data acquisition and display. In particular, for data packets containing display information, 'blank spaces' are displayed in the absence of their associated flags, and any corresponding spurious data packets left in the page memory from a previous one ignored. These 'found' flags are respective bits which are stored in a 'found' register which is reset in response to the detection of a selected page.

However, this prior means of 'pseudo' clearing a page memory may have limitations due to the current trend in teletext information transmissions to include for various software control and extended display options many so-called extension data packets which are additional to the (24) data packets used for transmitting basic display information. In fact, latest teletext specifications permit up to 74 data packets to be associated with each teletext page for 625-line television systems. Therefore, if the bits representing 'found' flags for all these data packets are packed into $74/8 = 10$ 8-bit byte locations it is necessary to write to all ten of these locations (which would form the 'found' register) in the page clearing interval. In a worst case (e.g. in full channel operation), only the 64 $\mu$s time for a television line is all that is available for acquisition of a data packet (40 bytes) including clearing of page memories, together with other possible control functions involved with the actual display. The actual time which could be allocated to clearing the page memories may be insufficient for the prior means of 'psuedo', clearing a page memory discussed above to be performed, in that when a given data packet is received by a teletext decoder it is necessary to calculate the byte and bit address of the 'found' register where the associated 'found' flag bit is stored and then to do a read/modify/write cycle to set only that bit and to leave the other bits in the same byte unchanged. This would require time-consuming logic.

SUMMARY OF THE INVENTION

It is an object of the present invention to provide in a teletext decoder an improved means of 'pseudo' clearing a page memory which does not suffer to the same extent the possible limitations set forth above of the prior means.

According to one aspect of the present invention there is provided a teletext decoder for teletext information comprising a plurality of different pages each of which is identified by a respective page number and each of which comprises a plurality of data packets each having a respective address; said teletext decoder including means for selecting a page by its page number, means for detecting a selected page number when received, and at least one page memory for storing received data packets of a selected page in a respective memory portion which is identified by the data packet address, the page memory being a write/read random access memory which data packets can be written into at the respective memory portions to over-write and thereby replace any data packets currently stored therein; and said teletext decoder being characterised by further including control means for permitting utilisation of only the stored data packets of the selected page, said control means comprising means for allocating a reference flag number to a selected page on detection thereof, means for allocating that reference flag number as a packet related flag number to each data packet which is received for the selected page, means for inhibiting utilisation of any data packet stored in the page memory whose packet related flag number is not the same as the reference flag number, and means for changing the reference flag number for each successively selected page.

The control means in accordance with the present invention provides that when a packet related flag number is the same as the reference flag number the data packet concerned is considered to have been received for the selected page. Otherwise, the data packet is considered not to have arrived. For 'pseudo' page clearing, the reference flag number is simply changed for the next selected page, after which the existing page is considered to be cleared from the page memory. The data packets of the existing page which are not over-written by data packets of the next selected page and therefore remain on the page memory are withdrawn from utilisation because their packet related flag number does not correspond to the reference flag number allocated to the next page. Thus, 'pseudo' page clearing is achieved by changing only a single flag number.

In carrying out the invention, each of the memory portions of the page memory can include a particular byte location for storing the flag number for the data packet whose address identifies the memory portion. The byte location included in the memory portion for the page header data packet of a page is preferably used to store the reference flag number for the page.

The reference flag number can be provided by a cyclic counter which is incremented by a predetermined amount e.g. one for each page selection. Assuming that, say a 4-bit counter is used then, when this counter has been incremented to decimal 15 it will overflow to 0 the next time it is incremented. However, in order that any residually stored data packet which has not been over-written for the entire cyclic count is not considered to be part of a currently selected page for which the reference flag number has been incremented to a value which is the same as the packet related flag for the residually stored data packet, the control means preferably performs at least once per cyclic count of the cyclic counter a correction operation in which the current reference flag number is compared with the current packet related flag number in each of the page memory portions and any of the latter numbers is changed to the reference flag number minus a predetermined number, e.g. one when it is not the same as the reference flag number.

Given a 4-bit reference flag number, the correction operation need only be performed once every 16 times the page memory is used to store a new page.

In a possible modification of the present invention in respect of received data packets which do not form page of any specific page, the teletext decoder can be provided with a region of memory, which is separate from the memory used for the one or more page memories, in which such data packets are stored and which have their own reference flag number and packet related flag numbers.

A further operating feature of a teletext decoder may involve checking each data byte of received data packets for parity or Hamming errors. For the performance of this operating feature, the teletext decoder can further include according to the invention means which are operable such that following the detection of an error in the first reception of a data byte to cause the data byte for a blank space or an error code to be written into the page memory in the relevant byte location of the relevant memory portion, whereas on subsequent receptions of the data byte an error will cause a write inhibit condition to obtain.

According to another aspect of the present invention there is provided a method of processing teletext information comprising a plurality of different pages each of which is identified by a respective page number and each of which comprises a plurality of data packets each having a respective address; said method comprising the steps of selecting a page by its page number, detecting a selected page number when received, and storing received data packets of a selected page in a respective memory portion of a page memory which is identified by the data packet address, the page memory being a write/read random access memory which data packets can be written into at the respective memory portions to over-write and thereby replace any data packets currently stored therein; said method being characterised by the further step of permitting utilisation of only the stored data packets of the selected page, said further step including the subsidiary steps of allocating a reference flag number to a selected page on detection thereof, allocating that reference flag number as a packet related flag number to each data packet which is received for the selected page, inhibiting utilisation of any data packet stored in the page memory whose packet related flag number is not the same as the reference flag number, and changing the reference flag number for each successively selected page.

In carrying out the invention, the method according to the aforesaid another aspect may be characterised in that the reference flag number is provided by a cyclic counter which is incremented by a predetermined amount e.g. one for each page selection and further characterised in that at least once per cyclic count of the cyclic counter a correction operation is carried out in which the current reference flag number is compared with the current packet related flag number in each of the page memory portions and any of the latter numbers is changed to the reference flag number minus a predetermined number e.g. one when it is not the same as the reference flag number.

Alternatively, in carrying out the invention, the method according to the aforesaid another aspect may be characterised by the step of checking each data byte of received data packets for parity or Hamming errors, and following the detection of an error in the first reception of a data byte causing the data byte for a blank space or an error code to be written into the page memory in the relevant byte location of the relevant memory portion.

BRIEF DESCRIPTION OF THE DRAWING

In order that the invention may be more fully understood reference will now be made by way of example to the accompanying drawings, of which.

DETAILED DESCRIPTION OF THE PREFERRED EMBODIMENTS

Figure 1:
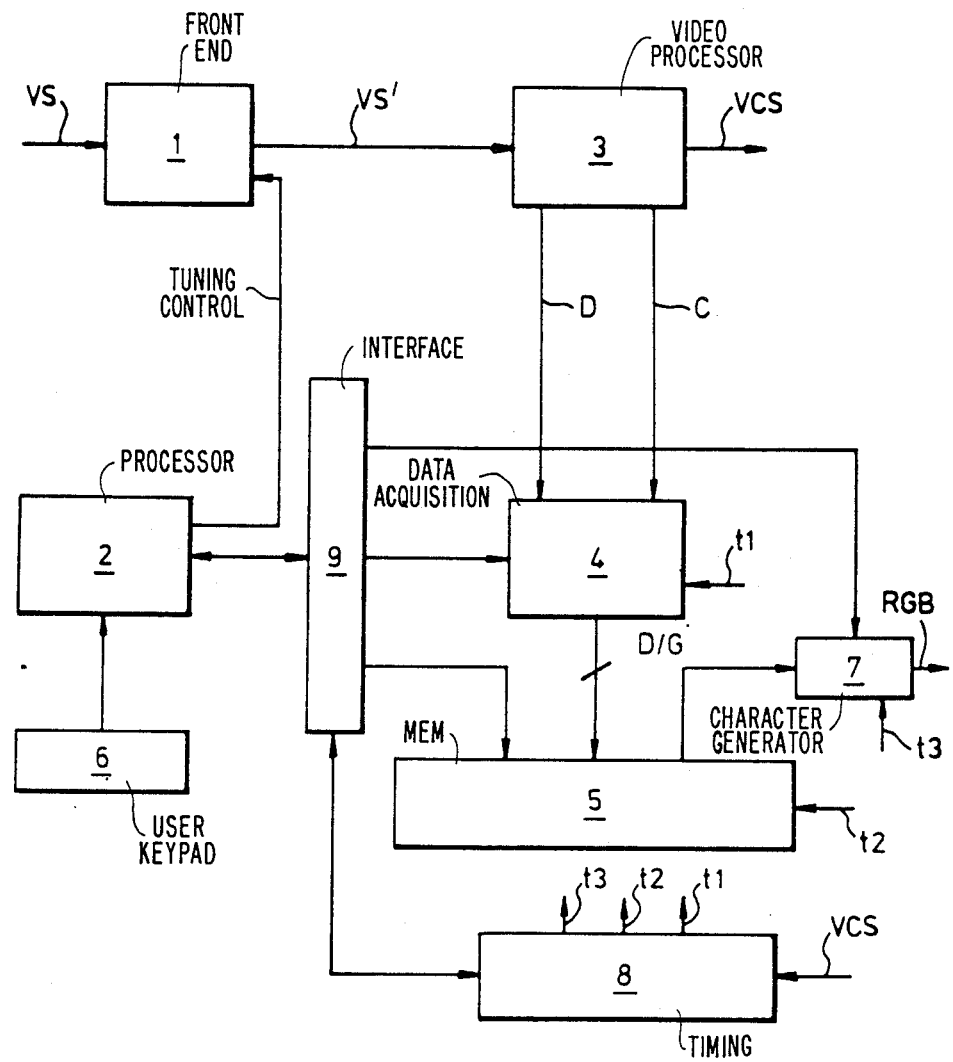
FIG. 1 is a block diagram of a teletext decoder in which the invention is embodied.

Referring to the drawings, the teletext decoder shown in FIG. 1 has a front end 1 for receiving an incoming television signal VS which is encoded with teletext data. This front end 1 comprises the usual amplifying, tuning and i.f. detector circuits and is under tuning control of processor means 2. The demodulated video signal VS' produced at the output of the front end 1 is applied to a video processor circuit 3 which performs data slicing for retrieving teletext data pulses D from the video signal VS'. The video processor circuit 3 also produces input data clock pulses C from the data pulses D. The data pulses D are fed together with the clock pulses C to a data acquisition circuit 4 which is operable to feed selected groups D/G of the data pulses to a memory 5 as address, message and control information. The memory 5 has a capacity for storing a plurality of pages, each comprising a plurality of data packets, in respective page memory sections, which are conveniently referred to as chapters, a data acquisition circuit 4 being provided in respect of each page that can be stored.

The processor means 2 is operable in accordance with 'select' signals applied to it from a user keypad 6 to control channel selection and which pages, as composed of the selected groups D/G of the data pulses, are acquired by the data acquisition circuit 4 and stored in the memory 5. Message information stored in the memory 5 is used to drive a character generator 7 which produces R,G,B component signals for display purposes, under the control of a timing circuit 8 which provides timing signals on connections t1, t2 and t3 for the circuit elements 4, 5 and 7. These circuit elements and the timing circuit 8 are accessed by the processor means 2 via an interface circuit 9. The operation of the timing circuit 8 is synchronised with the received video signal VS by a composite pulse signal VCS which contains the line and field synchronising pulses which are separated from the demodulated video signal VS' in the video processor circuit 3.

As has already been mentioned, the memory 5 has the capacity for storing a plurality of different pages under the control of the keypad 6.

The aforementioned "Broadcast Teletext Specification" defined a page for storage in the memory 5 and for subsequent display on a television receiver as comprising 24 rows each of 40 characters. Each of the characters is defined by an 8-bit byte. The teletext display data therefore consists of 24 rows, or data packets, as they have subsequently come to be called, each of 40 bytes. The 24 data packets are conveniently referred to as data packets 0, corresponding to the page header data packet, to 23.

The aforementioned "World System Teletext and Data Broadcasting System—Technical Specification" relates to an enhanced teletext specification in which additional information is transmitted to the teletext decoder in the form of additional "extension" packets numbered 24 to 31 which do not form part of the basic display page. The extension packets 24 and 25 have the same format as normal data packets and contain 40 8-bit bytes which can be used for additional page related display data to give user control information for more sophisticated decoders. Extension packet 26 is used to provide enhanced display facilities, extension packet 27 is used to defined linked page addresses required for so-called FASTEXT operation, and extension packet 28 is used to redefine the character set and the colours to be used when displaying the basic page. Each of the extension packets 26 to 28 can be transmitted in up to sixteen versions and so each take up 16 rows in the page memory.

Extension packets 24 to 28 are all page related in that, where applicable, they are transmitted each time a page is transmitted and are associated with a page header (packet 0).

Extension packets 29 to 31 are non-page related packets in that they are not transmitted for each page. Extension packet 29 is used to redefine the character set and colours to be used throughout a particular group of pages, more usually referred to as a "Magazine", extension packet 30 is used to give general information on the transmission and is called the "broadcasting service data" packet, and extension packet 31 is used for commercial data services.

It should be appreciated that not all of the data packets need necessarily be used. For example, in Germany, only packets 0 to 23 are in current use; in the U.K. packets 24, 27 and 30 are also transmitted and Spain also requires packet 26.

Figure 2:
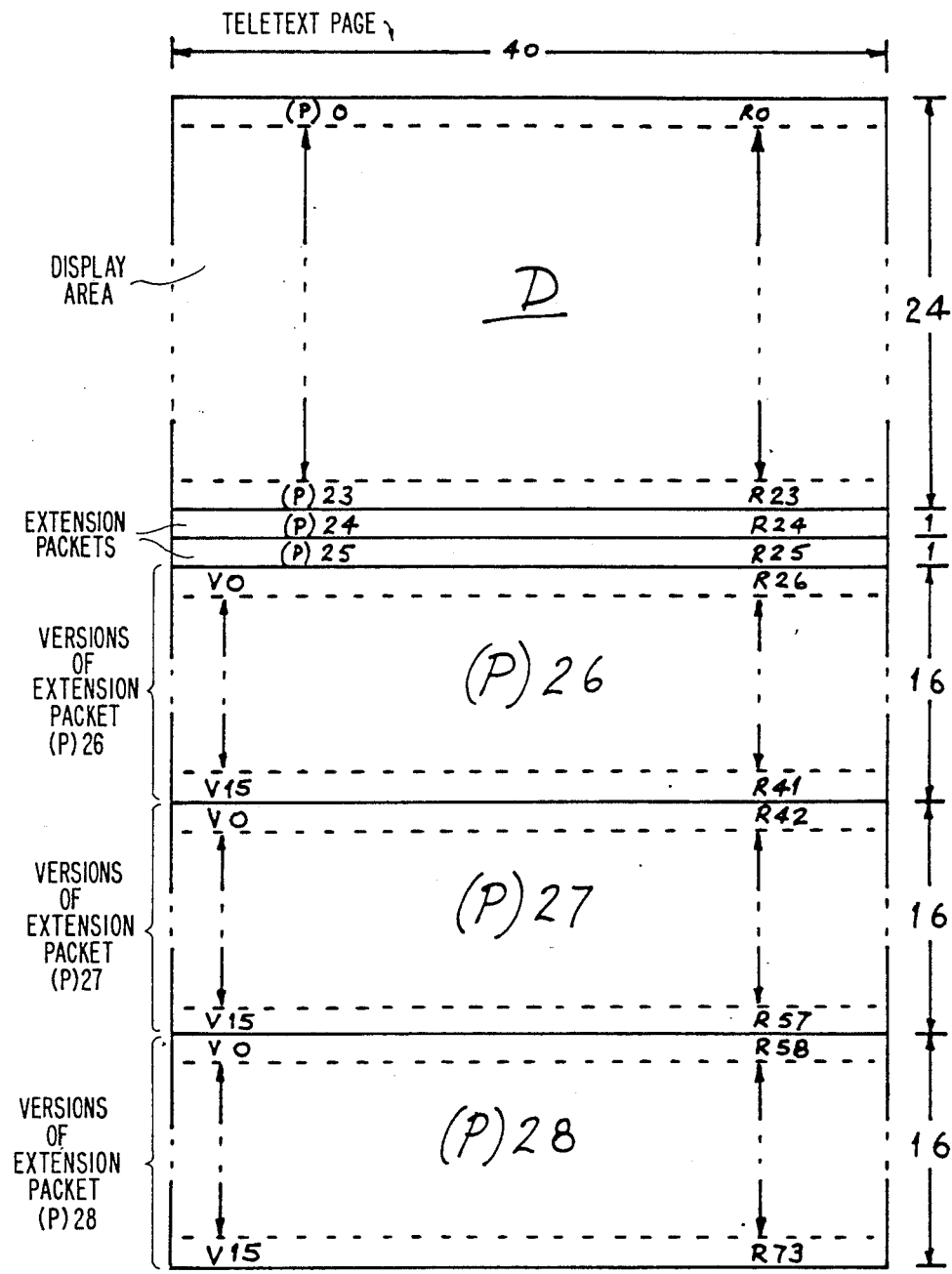
FIG. 2 is a diagrammatic representation of a typical conventional teletext page stored in the memory of FIG. 1.

A typical page format as defined by the aforementioned "World System Teletext Technical Specification" is shown in FIG. 2 of the accompanying drawings.

The teletext page shown in FIG. 2 comprises a display area D which corresponds to the actual teletext page which is displayed on a television receiver. The display area consists of 24 rows R0 to R23, each of which consists of 40 bytes. In rows R0 to R23 are stored data packets (P)0 to (P)23 respectively. Extension data packet (P)24 is stored in row R24; extension packet (P)25 is stored in row R25; versions V0 to V15 of extension packet (P)26 are stored in rows R26 to R41; versions V0 to V15 of extension packet (P)27 are stored in rows R24 to R57 and versions V0 to V15 of extension packet (P)28 are stored in rows 58 to 73. The page shown thus consists of 74 rows each of 40 bytes. The non page related packets 29, 30 and 31 are not shown.

When a page, such as that described with reference to FIG. 2 has been received by a teletext decoder and stored in the page memory thereof, if a new page is then selected, it is usually necessary to clear the page memory before the new page arrives. This is because row adaptive transmission techniques are used where all the data packets of a particular page are not necessarily transmitted, and if the page memory is not cleared it is possible that the new page when displayed will be corrupted by existing rows from previously stored pages.

In order to obviate the need to clear each page memory before a newly selected page arrives, it is proposed that each page, as it is acquired, is allotted a reference flag number, and also that each data packet which relates to that page is allotted a packet related flag number which is the same as the page reference flag number. For display purposes, etc. the packet related flag number of each data packet is compared with the page reference flag number and if the two are the same the corresponding data packet is read out of memory, but if the two are not the same, the data packet is deemed not to have arrived and a row of blank spaces is displayed in its place. Thus, in order to effect 'pseudo' clearing of a page it is only necessary to ensure that when a newly selected page is being acquired, it is allotted a reference flag number which is different from all the packet related flag numbers that exist in the memory. This can be achieved, for example, by incrementing the reference flag number by 1 for each newly selected page.

Figure 3:
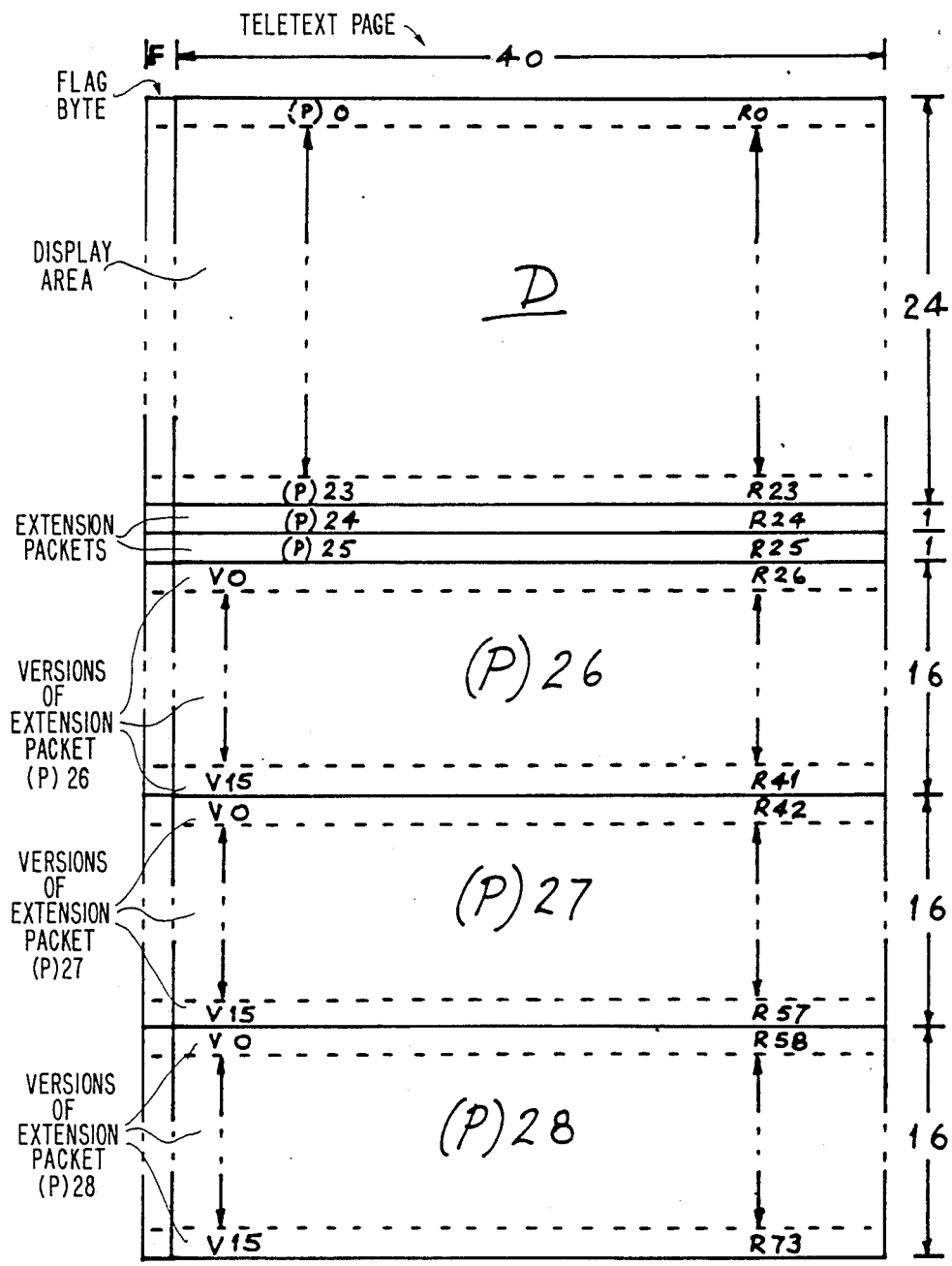
FIG. 3 shows the teletext page of FIG. 2 modified in accordance with the present invention.

In order to implement the above, provision must be made in the page memory of the teletext decoder to store the reference flag number and packet related flag numbers relating to the data packets corresponding to each stored page. This is most easily done by introducing an extra byte into each row of the memory. In FIG. 3 there is shown a modification of the page format of FIG. 2 in which an extra byte F is provided at the beginning of each row in which the reference flag number of the packet related flag number is stored. It has been found that a sufficient range of flag numbers, i.e. 16 can be obtained using only 4-bits of the additional byte F, in which case the remaining 4-bits may be used for other control purposes.

It should be appreciated that it is not necessary that the page reference flag numbers and the packet related flag numbers be stored alongside the respective data packets and they could be stored at any convenient location in the memory. However, storing them as part of each data packet results in less complex processing. In the arrangement shown in FIG. 3, when a new page is being acquired, its reference flag number will be stored in byte F of the first data packet (P)0 of each page, which is termed the page header, and is stored in row R0 of the memory. The packet related flag numbers for each subsequent data packet relating to that page are stored in the byte F relating to each particular data packet which are stored in the subsequent rows of the memory.

The non-page related packets 29, 30 and 31 (not shown in FIGS. 2 and 3) can be treated in a similar way. A reference flag number is allocated to them as are packet related flag numbers. However, because these packets are non-page related the reference flag number is not incremented by the arrival of a page header. Instead the processor 2 (FIG. 1) is arranged to change the value of the reference flag number, and thus is compared with the packet related flag numbers of the packets to determine whether or not they are deemed to have been received or not.

By using a 4-bit flag number for the page reference flag number and the packet related flag numbers, up to sixteen different flag numbers may exist in the memory at any one time. Should it happen that any particular data packet has remained unchanged for 16 subsequent page selections, then it will have a packet related flag number which corresponds to the current page reference flag number and the particular data packet would be read out from memory as though it were part of that page. This would show up on the display as a corrupt line of data which is undesirable. In order to overcome this, it is arranged that once in every cycle of 16 page selections, a MAINTENANCE operation is carried out in which each packet related flag number is compared with the current reference flag number and if they are not the same the packet related flag number is changed to be one less than the current reference flag number.

Another problem that can exist in the proposed system is that in normal teletext processing, a parity error check is carried out on each character byte and if an error is detected the byte is not written into memory. In teletext decoders which make use of actual page clearing, the places where "error" bytes have been received show up on the displayed page as blank spaces. In the present case where actual page clearing is not effected, the places where "error" bytes occur would not have been over-written with a blank space and the character that was previously in that position will still exist in the memory. Thus, when the particular row is read out of memory for display purposes, the bytes that were in error will be read out as corrupt characters. In order to overcome this problem, it is arranged that where a parity error is detected in any packet, and it is the first occurrence of that packet (or a C4 page erase instruction has been received as defined in the said "Broadcast Teletext Specification"), a blank space is written into memory in place of the character byte in error. Where it is not the first occurrence of a packet, and the C4 page erase instruction has not been received, the existing character byte stored in the memory is retained. In this way so-called "error integration" is achieved so that by the time a page has been received a number of times, any character errors should have been removed. First reception of a packet is determined by a comparison of the existing packet related flag number with the reference flag number. If they are different it is the first reception, if they are the same it is not the first reception. In the case of Hamming encoded data bytes which are detected as being in error are either corrected (if possible) and then written into memory or if the error is not correctable an error code is written into memory on first reception and on subsequent receptions of that packet no writing takes place.

In order to facilitate initialisation of the reference flag numbers and the packet related flag numbers when the teletext decoder is initially powered up, an automatic process may be invoked which, in effect, clears all the pages in the memory by indicating that no packets are present. This is achieved by comparing the reference flag number for each of the pages that are stored in the memory with the packet related flag numbers in the memory relating to that page, and setting the packet related flag number to one less than the respective reference flag number.

The various operations described above with reference to FIG. 3 will now be described with reference to the circuit diagram of FIG. 4 which depicts some of the elements of the teletext decoder of FIG. 1 in greater detail.

Figure 4:
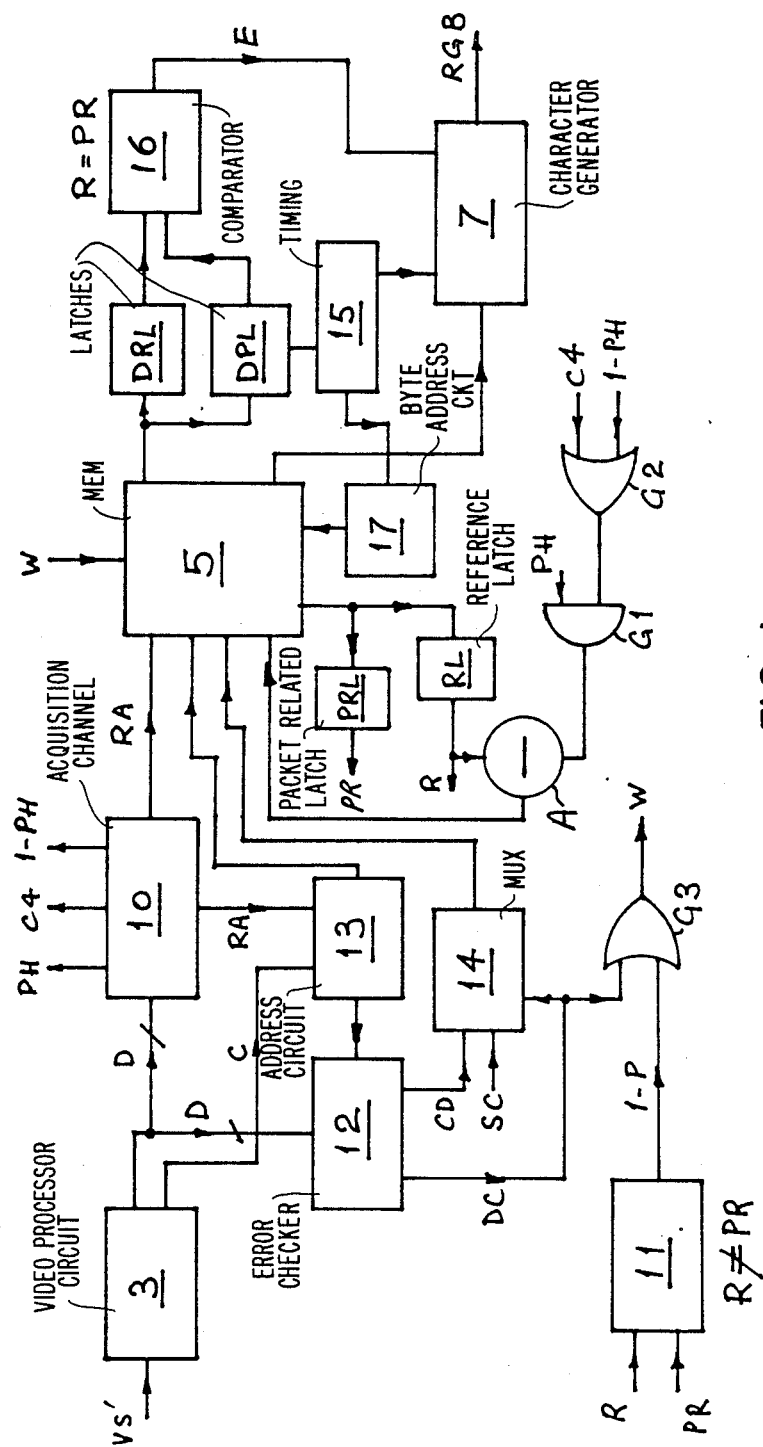
FIG. 4 is a block diagram showing elements of the teletext decoder of FIG. 1 in greater detail.

In FIG. 4, data pulses D from the video processor circuit 3 are fed to an acquisition channel 10, of which there may be more than one, which forms part of the data acquisition circuit 4 of FIG. 1. This inspects the magazine and row address data of each incoming packet. Page headers, i.e. packets with row address R0, are compared with a user defined requested page number entered via the keypad 6 (FIG. 1) and applied to the acquisition channel 10 via the interface circuit 9 (FIG. 1). An area of the memory 5 will already have been defined into which the requested page should be written. If the incoming packet signifies the start of the requested page, the following events are initiated:

1. A flag PH is set by the acquisition channel 10 to indicate that the incoming packet is the correct page header.

2. A flag 1-PH is set by the acquisition channel 10 if this is the first time that the page header has been received since the page was requested.

3. A flag C4 is set by the acquisition channel 10 corresponding to the state of the C4 (Erase page) control bit within the control group of the page header.

4. The acquisition channel 10 calculates the memory row address RA where the reference flag number is stored (row R0, byte F).

5. The current reference flag number is read from the memory 5 and stored in a reference latch RL.

6. The reference latch RL provides one input to an adder circuit A. Two gates, an AND gate G1 and an OR gate G2, afford a value for the other input to adder circuit A. If the correct page header PH is being received by the acquisition channel 10 the value will be generated by the adder circuit A if the 1-PH flag or the C4 flag has been set by the acquisition channel 10. Thus the adder circuit A increments the current page reference flag number by 1 if 'pseudo' page clearing is required (If the page reference flag number is 15 it is incremented to 0).

7. The new reference flag number is written back into the memory 5 by the adder A.

The packets transmitted after the requested page header are usually the packets forming the rest of the page. The acquisition channel 10 identifies such packets and allows them to be stored in the memory 5. The packet related flag number for each packet received is updated as follows:

1. The flag PH set by the acquisition channel 10 is cleared to indicate that the incoming packet is not a page header.

2. The acquisition channel 10 calculates the memory row address RA where the reference flag number is stored.

3. The reference flag number is read from the memory 5 and stored in the reference latch RL.

4. The acquisition channel 10 calculates the memory row address where the packet related flag number is stored.

5. The current packet related flag number is read from the memory 5 and stored in a packet related latch PRL.

6. The output R from the reference latch RL and the output PR from the packet related latch PRL are compared in a comparator 11. If they are not equal then a first reception flag 1−P is set.

7. Since the PH flag is not set, the gates G1 and G2 will apply a 0 to the input of adder A and the adder A will add 0 to the number stored in the reference latch RL. This number is then written into the memory 5 at the packet related flag number position under the control of a write signal W derived from the first reception flag via an OR-gate G3. Thus the packet related flag number is updated with the current reference flag number to indicate that a packet has been received for that page.

This procedure is repeated for each of the packets received relating to the selected page.

In order to carry out a parity error check on each of the received character bytes, the non-address data pulses D from the video processor circuit 3 are applied to an error checker 12. This is controlled by an address circuit 13 which receives packet row address information RA from the acquisition channel 10 and clock pulses C from the video processor circuit 3 in synchronism with the incoming data pulses D. This enables the error checker 12 to identify the correct checking algorithm to be applied to the incoming data byte (i.e. parity, [8,4] Hamming, [24,18] Hamming, or no error check). The error checker 12 affords a corrected data output CD and sets a data correct flag DC. The data correct flag is set high if the incoming character byte is error free or if the error checker 12 is able to correct a single error. A multiplexer 14 selects between the corrected data CD and a space code SC applied to it and is controlled by the data correct flag DC. When the data correct flag DC is set high the multiplexer outputs the corrected data, and when this data correct flag is set low the multiplexer outputs the space code SC, the corrected data CD or the space code SC providing the character byte to be written into the memory 5 at the location specified by the address circuit 13 under the control of the write signal W which is derived via gate G3 on first reception of the packet from the first reception flag and subsequent receptions of the data correct flag.

In order to display a page stored in the memory 5, a timing circuit 15 is provided which controls the readout of the reference flag numbers, the packet related flag numbers and the character data from the memory 5 in conjunction with a byte address circuit 17. Between the start of a television field scan and the start of the display of the teletext data, the reference flag number is read from the memory 5 and stored in a display reference latch DRL. As each display row is read out from the memory 5 its packet related flag number is stored in a display packet related latch DPL. The outputs from the latches DRL and DPL are compared in a comparator 16 which affords an enable signal E to the character generator 7. If the two outputs are equal, the character generator 7 is enabled and that display row is applied to the character generator 7. If the two inputs are not equal the character generator is not enabled and it substitutes a row of 40 spaces.

In this way all display rows which have the same packet related flag number as the current reference flag number are displayed, otherwise rows of blank spaces are displayed.

Figure 5:
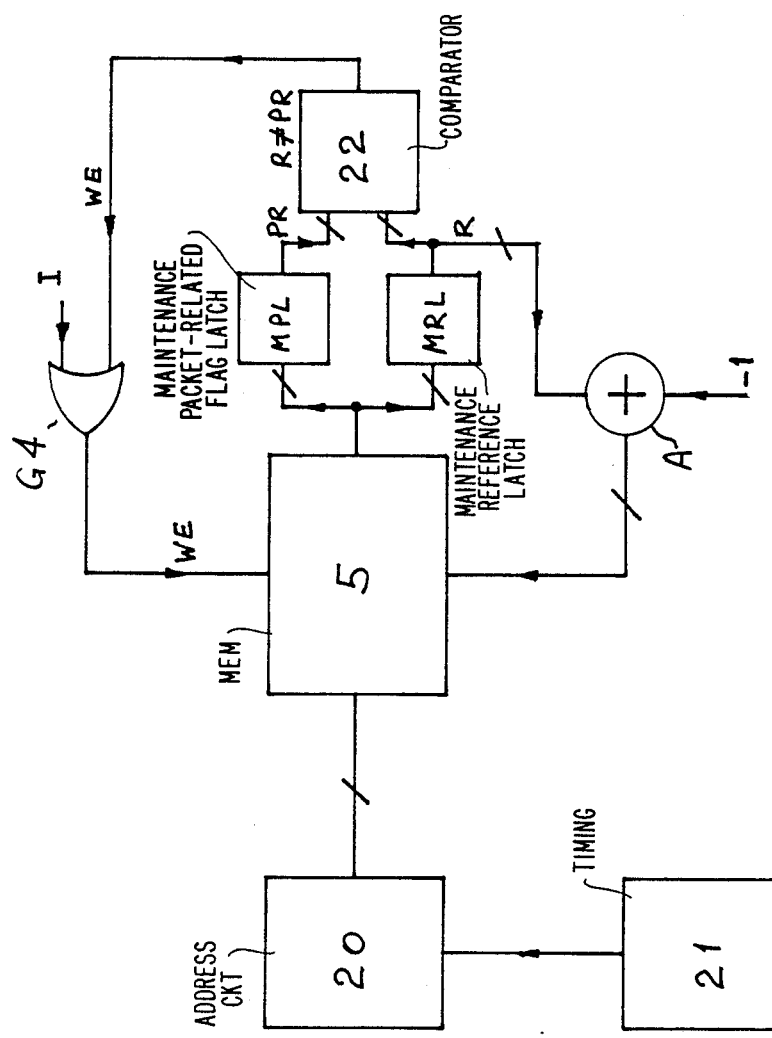
FIG. 5 is a block diagram of an arrangement for effecting maintenance and initialisation of the elements shown in FIG. 4.

In FIG. 5 of the drawings there is shown an arrangement for effecting the maintenance and initialisation of the reference flag numbers and the packet related flag numbers.

Maintenance of the flag numbers is required in order to ensure that a packet which remains in the memory for a full cycle of 16 page selections is not able to corrupt a subsequently displayed page. This is achieved by comparing each packet related flag number with the reference flag number, and setting the packet related flag number to be one less than the reference flag number. This is effected by the arrangement of FIG. 5 at a time when the flags are not being accessed by other circuits. An address circuit 20 is provided which cycles through the memory 5 under the control of a timing circuit 21. The reference flag number for each page is read out of the memory 5 and is stored in a maintenance reference latch MRL. For each row within the stored page the packet related flag number is read out from the memory 5 and is stored in a maintenance packet related flag latch MPL. The outputs from the two latches MRL and MPL are compared in a comparator 22 and if they are not equal a write enable signal WE is generated which is applied to the memory 5 via an OR gate G4. The output from the maintenance reference latch MLR is applied to an adder circuit A in which it is added to a value of −1. The output from the adder circuit A is then read back into the memory 5 under the control of the write enable signal WE in place of the packet related flag number that was currently being read out.

In order to effect initialisation of the reference flag numbers and the packet related flag numbers when the teletext decoder is initially powered-up, an input I is applied to the OR gate G4 and initialisation is effected in the same way as the maintenance operation was effected.

In the teletext decoder that has been described, incrementing of the reference flag number has been effected by hardware control. It should be appreciated that in an alternative arrangement control could be effected by the microprocessor 2 (FIG. 1). The processor means 2 can then compare a packet related flag number with a reference flag number in order to determine whether that packet has been received.

From reading the present disclosure, other modifications will be apparent to persons skilled in the art. Such modifications may involve other features which are already known per se and which may be used instead of or in addition to features already described herein. Although claims have been formulated in this application to particular combinations of features, it should be understood that the scope of the disclosure of the present application also includes any novel feature or any novel combination of features disclosed herein either explicitly or any generalisation or modification thereof which would be apparent to persons skilled in the art, whether or not it relates to the same invention as presently claimed in any claim and whether or not it mitigates any or all of the same technical problems as does the present invention. The applicants hereby reserve the right to formulate new claims to such features and/or combinations of such features during the prosecution of the present application or of any further application derived therefrom.

I claim:

1. A teletext decoder for teletext information comprising a plurality of different pages each of which is identified by a respective page number and each of which includes a plurality of data packets each having a respective address; said teletext decoder comprising:
   (a) means for selecting a page by its page number,
   (b) means for detecting a selected page number when received,
   (c) at least one page memory for storing received data packets of a selected page in a respective page memory portion which is identified by the data packet address, the page memory being a write-/read random access memory which data packets can be written into at the respective memory portions to over-write, and thereby replace, any data data packets currently stored therein, and
   (d) control means for permitting utilisation of only the stored data packets of the selected page, said control means comprising:
      (i) means for allocating a reference flag number to the selected page on detection of the selected page,
      (ii) means for allocating that reference flag number as a packet related flag number to each data packet which is received for the selected page,
      (iii) means for inhibiting utilisation of any data packet stored in the page memory whose packet related flag number is not the same as the reference flag number, and
      (iv) means for changing the reference flag number for each successively selected page.

2. A decoder as claimed in claim 1, characterised in that each of the memory portions of the page memory includes a particular byte location for storing the flag number for the data packet whose address identifies the memory portion.

3. A decoder as claimed in claim 2, characterised in that the byte location included in the memory portion for the page header data packet of a page is used to store the reference flag number for the page.

4. A decoder as claimed in any preceding claim, characterised in that the reference flag number is provided by a cyclic counter which is incremented by a predetermined amount for each page selection.

5. A decoder as claimed in claim 4, characterised in that the control means performs at least once per cyclic count of the cyclic counter a correction operation in which the current reference flag number is compared with the current packet related flag number in each of the page memory portions and any of the latter numbers is changed to the reference flag number minus a predetermined number when it is not the same as the reference flag number.

6. A decoder as claimed in claim 1, further comprising:
   (a) means for checking each data byte of received data packets for parity or Hamming errors; and
   (b) means for, following detection of an error in reception of a data byte, causing a data byte indicating a blank space or an error code to be written into the page memory in a relevant byte location of the respective memory portion.

7. A decoder as claimed in claim 6, characterised in that on subsequent receptions of said data byte an error will cause a write inhibit condition.

8. A method of processing teletext information including a plurality of different pages each of which is identified by a respective page number and each of which comprises a plurality of data packets each having a respective address; said method comprising the steps of:
- (a) selecting a page by its page number,
- (b) detecting a selected page number when received,
- (c) storing received data packets of a selected page in a respective memory portion of a page memory which is identified by the data packet address, the page memory being a write/read random access memory which data packets can be written into at the respective memory portions to over-write, and thereby replace, any data packets currently stored therein, and
- (d) permitting utilisation of only the stored data packets of the selected page, including the subsidiary steps of:
  - (i) allocating a reference flag number to the selected page on detection of the selected page,
  - (ii) allocating that reference flag number as a packet related flag number to each data packet which is received for the selected page,
  - (iii) inhibiting utilisation of any data packet stored in the page memory whose packet related flag number is not the same as the reference flag number, and
  - (iv) changing the reference flag number of each successively selected page.

9. A method as claimed in claim 8, characterised in that the reference flag number is provided by a cyclic counter which is incremented by a predetermined amount for each page selection, and in that at least once per cyclic count of the cyclic counter a correction operation is carried out in which the current reference flag number is compared with the current packet related flag number in each of the page memory portions and any of the latter numbers is changed to the reference flag number minus a predetermined number when it is not the same as the reference flag number.

10. A method as claimed in claim 8 or claim 9, characterised by the steps of checking each data byte of received data packets for parity or Hamming errors, and following the detection of an error in the first reception of a data byte causing the data byte for a blank space or an error code to be written into the page memory in the relevant byte location of the relevant memory portion.

11. A television receiver incorporating a teletext decoder as claimed in any one of the preceding claims 1, 3, 6, or 7.

12. A television receiver incorporating a teletext decoder as claimed in claim 4.

13. A television receiver incorporating a teletext decoder as claimed in claim 5.

* * * * *